(12) United States Patent
Cho et al.

(10) Patent No.: US 8,574,730 B2
(45) Date of Patent: *Nov. 5, 2013

(54) MAGNETIC TRACKS, INFORMATION STORAGE DEVICES USING MAGNETIC DOMAIN WALL MOVEMENT, AND METHODS OF MANUFACTURING THE SAME

(75) Inventors: Young-jin Cho, Suwon-si (KR); Sung-chul Lee, Osan-si (KR); Kwang-seok Kim, Sengnam-si (KR); Ji-young Bae, Busan (KR); Sun-ae Seo, Hwaseong-si (KR); Chang-won Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1332 days.

This patent is subject to a terminal disclaimer.

(21) Appl. No.: 12/155,896

(22) Filed: Jun. 11, 2008

(65) Prior Publication Data

US 2009/0073859 A1    Mar. 19, 2009

(30) Foreign Application Priority Data

Sep. 14, 2007  (KR) .................. 10-2007-0093847

(51) Int. Cl.
  *G11B 5/76*    (2006.01)
  *G11C 19/08*   (2006.01)
  *H01L 35/04*   (2006.01)

(52) U.S. Cl.
  USPC ............. 428/832; 365/81; 365/87; 365/171; 365/173

(58) Field of Classification Search
  None
  See application file for complete search history.

(56) References Cited

U.S. PATENT DOCUMENTS

| | | | |
|---|---|---|---|
| 6,014,296 A * | 1/2000 | Ichihara et al. | 360/135 |
| 6,781,087 B1 | 8/2004 | Chism, Jr. et al. | |
| 6,834,005 B1 | 12/2004 | Parkin | |
| 6,955,926 B2 | 10/2005 | Chen et al. | |
| 7,422,808 B2 * | 9/2008 | Sugimoto et al. | 428/828.1 |

(Continued)

FOREIGN PATENT DOCUMENTS

| | | |
|---|---|---|
| EP | 1708257 A1 * | 10/2006 |
| JP | 2002-280640 | 9/2002 |

(Continued)

OTHER PUBLICATIONS

Derwent Abstract Translation of KR 718153 B1 (May 8, 2007).*

(Continued)

*Primary Examiner* — Kevin Bernatz
(74) *Attorney, Agent, or Firm* — Harness, Dickey & Pierce, P.L.C.

(57) ABSTRACT

Information storage devices and methods of manufacturing the same are provided. A magnetic track of the information storage device includes a magnetic layer in which at least one magnetic domain forming region and at least one magnetic domain wall forming region are alternately disposed in a lengthwise direction. The at least one magnetic domain forming regions has a different magnetic anisotropic energy relative to the at least one magnetic domain wall forming region. An intermediate layer is formed under the magnetic layer. The intermediate layer includes at least one first material region and at least one second material region. Each of the at least one first material regions and the at least one second material regions corresponds to one of the at least one magnetic domain forming regions and the at least one magnetic domain wall forming regions.

22 Claims, 5 Drawing Sheets

(56) References Cited

U.S. PATENT DOCUMENTS

| | | | |
|---|---|---|---|
| 7,910,232 B2* | 3/2011 | Lee et al. | 428/832 |
| 7,929,342 B2* | 4/2011 | Numata et al. | 365/171 |
| 2005/0220990 A1* | 10/2005 | Aoyama et al. | 427/127 |
| 2006/0062132 A1* | 3/2006 | Van Kesteren | 369/275.1 |
| 2007/0086121 A1* | 4/2007 | Nagase et al. | 360/324.1 |
| 2007/0195588 A1* | 8/2007 | Kim et al. | 365/158 |
| 2008/0014424 A1* | 1/2008 | Lim et al. | 428/220 |
| 2008/0165576 A1* | 7/2008 | Deligianni et al. | 365/171 |
| 2009/0097365 A1* | 4/2009 | Lee et al. | 369/13.35 |
| 2009/0130492 A1* | 5/2009 | Lee et al. | 428/846.6 |
| 2009/0180210 A1* | 7/2009 | Lee et al. | 360/59 |
| 2009/0239100 A1* | 9/2009 | Watanabe | 428/828 |

FOREIGN PATENT DOCUMENTS

| | | |
|---|---|---|
| JP | 2003-197872 | 7/2003 |
| JP | 2005-302204 | 10/2005 |
| KR | 10-2006-0104493 | 10/2006 |
| KR | 10-2007-0014597 | 2/2007 |

OTHER PUBLICATIONS

Korean Office Action dated Feb. 12, 2013, issued in corresponding Korean Application No. 10-2007-0093847.

* cited by examiner

MAGNETIC TRACKS, INFORMATION STORAGE DEVICES USING MAGNETIC DOMAIN WALL MOVEMENT, AND METHODS OF MANUFACTURING THE SAME

PRIORITY STATEMENT

This application claims priority under 35 U.S.C. §119 to Korean Patent Application No. 10-2007-0093847, filed on Sep. 14, 2007, in the Korean Intellectual Property Office (KIPO), the disclosure of which is incorporated herein in its entirety by reference.

BACKGROUND

Description of the Related Art

Nonvolatile information storage devices such as hard disk drives (HDDs) and nonvolatile random access memories (RAMs) retain recorded information even when power is cut-off.

A conventional HDD stores recorded information using a rotating part. The rotating part may wear down over time, which increases the possibility of operational failure. This increased possibility of operational failure reduces reliability.

An example of a conventional non-volatile RAM is a flash memory. Conventional flash memories do not use a rotating part. As such, conventional flash memories do not suffer from the same wear as conventional HDDs. However, conventional flash memories have relatively slow reading and writing speeds, relatively short life spans, and relatively small storage capacity when compared to a conventional HDD. In addition, conventional flash memories have relatively high manufacturing costs.

Another nonvolatile information storage device uses magnetic domain wall movement of a magnetic material. In these conventional information storage devices, a minute magnetic region—a ferromagnetic substance—is referred to as a magnetic domain. A boundary portion between magnetic domains having different magnetization directions is referred to as a magnetic domain wall. The magnetic domain wall may be moved by applying a current or an external magnetic field to a magnetic layer.

In one example, bit movement may be controlled by artificially forming a pinning site for dividing a continuous storage region using a magnetic domain wall between magnetic domains and by maintaining constant bits. In this conventional method, however, the pinning sites must be artificially formed, and thus, manufacturing processes are relatively complicated.

SUMMARY

Example embodiments relate to magnetic tracks, information storage devices and methods of manufacturing the same, for example, magnetic tracks, information storage devices including magnetic tracks in which a magnetic domain and a magnetic domain wall are formed, and methods of manufacturing the same.

Example embodiments provide magnetic tracks and information storage devices for controlling a magnetic domain wall without artificially forming a pinning site. Example embodiments also provide methods of manufacturing information storage devices.

At least one example embodiment provides a magnetic track. The magnetic track may include an intermediate layer and a magnetic layer. The intermediate layer may be arranged on a substrate. The intermediate layer may include at least one first material region forming a magnetic domain and at least one second material region forming a magnetic domain wall arranged alternately on the substrate. The magnetic layer may be formed on the intermediate layer in a lengthwise direction. The magnetic layer may include at least one magnetic domain forming region and at least one magnetic domain wall forming region arranged alternately in the lengthwise direction.

At least one example embodiment provides an information storage device. The information storage device may include a magnetic track having a plurality of magnetic domains. A current applying unit may be connected or coupled to the magnetic track. A read/write unit may also be included in the information storage device. The magnetic track may include an intermediate layer formed on a substrate. The intermediate layer may include a first material region forming a magnetic domain and a second material region forming a magnetic domain wall. The first and second material regions may be alternately disposed on the substrate. A magnetic layer may be formed on the intermediate layer in a lengthwise direction. The magnetic layer may include a magnetic domain forming region and a magnetic domain wall forming region alternately formed in the lengthwise direction.

According to at least some example embodiments, a magnetic anisotropic energy of the magnetic domain forming region may be between about $2\times10^3$ and about $10^7$ J/m$^3$, inclusive. A magnetic anisotropic energy of the magnetic domain wall forming region may be between about 10 and about $10^3$ J/m$^3$, inclusive.

At least one other example embodiment provides a method of manufacturing a magnetic track for an information storage device. According to at least this example embodiment, a seed layer may be formed on a substrate. An intermediate layer may be formed on the seed layer. The intermediate layer may include at least one first material region and at least one second material region arranged alternately. A magnetic layer may be formed on the intermediate layer. The magnetic layer may include at least one magnetic domain forming region and at least one magnetic domain wall forming region arranged alternately on the intermediate layer.

At least one other example embodiment provides a method of manufacturing an information storage device. According to at least this example embodiment, a seed layer may be formed on a substrate. An intermediate layer may be formed on the seed layer. The intermediate layer may include a first material region forming a magnetic domain and a second material region forming a magnetic domain wall. The first and second material regions may be alternately disposed on the seed layer. A magnetic layer may be formed on the intermediate layer. The magnetic layer may include a magnetic domain forming region and a magnetic domain wall forming region alternately formed in the lengthwise direction.

According to at least some example embodiments, the first material region may be formed of Pt and the second material region may be formed of Ru. The magnetic layer may be a multilayer or stack structure including CoFe and Pt.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
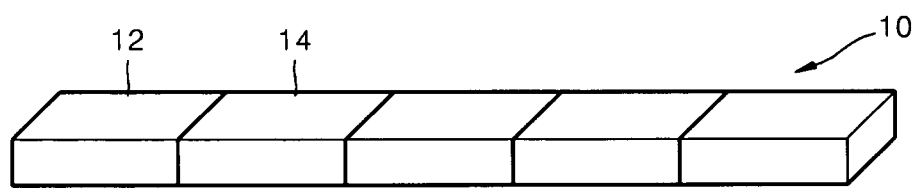
FIG. 1 illustrates a magnetic track of an information storage device according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments will be described in detail with reference to the attached drawings. In the description, the detailed descriptions of well-known functions and structures have been omitted so as not to hinder the understanding of the present invention.

FIG. 1 illustrates a magnetic track of an information storage device according to an example embodiment. Referring to FIG. 1, a magnetic track 10 of the information storage device may include a plurality of magnetic domains 12 and a plurality of magnetic domain walls 14 arranged alternately in a lengthwise direction.

The direction of rotation of electrons (e.g., the direction of a magnetic moment) may be the same throughout the magnetic domain 12. The size of the magnetic domain 12 and its magnetization direction may be controlled by the shape and size of a magnetic material and/or external energy. The magnetic domain wall 14 may serve as a boundary portion of magnetic domains having different magnetization directions. A spin exchange energy of the magnetic domain wall 14 may be smaller than a spin exchange energy of the magnetic domain 12 thereby forming a more stable energy state. Because the magnetic domain wall 14 is a pinning site having a relatively small magnetic anisotropic energy, bit movement of the magnetic domain wall 14 is possible and data recorded in a magnetic layer may be retained more stably.

The magnetic domain wall 14 may be moved by a current or an external magnetic field applied to the magnetic material. The magnetic anisotropic energy of the magnetic domain 12 may be between about $2 \times 10^3$ and about $10^7$ J/m$^3$, inclusive. The magnetic anisotropic energy of the magnetic domain wall 14 may be between about 10 and about $10^3$ J/m$^3$, inclusive.

An information storage device may include the magnetic track of FIG. 1, a current applying unit and a read/write unit coupled thereto. The current applying unit may move the magnetic domain wall 14 by, for example, applying a current each side portions of the magnetic track. A magnetic resistance device may be used as a reading unit to read information stored in the magnetic track.

Figure 2A:
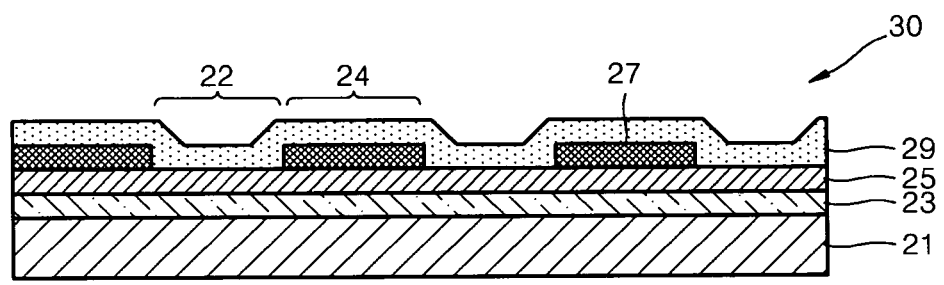
FIGS. 2A and 2B are cross-sectional views of modified examples for illustrating the structure of a magnetic track of an information storage device according to an example embodiment.
Figure 2B:
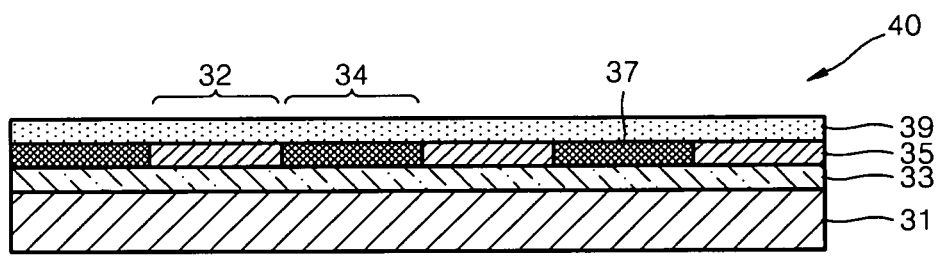

FIGS. 2A and 2B are cross-sectional views of example structures of magnetic tracks of information storage devices according to example embodiments.

Referring to FIG. 2A, magnetic track 30 may include a seed layer 23, intermediate layers 25 and 27, and magnetic layer 29 arranged sequentially on substrate 21. The magnetic layer 29 may be formed by alternately disposing magnetic domain forming regions 22 and magnetic domain wall forming regions 24 on the intermediate layers 25, 27.

Referring to FIG. 2B, magnetic track 40 may include a seed layer 33, intermediate layers 35 and 37 and a magnetic layer 39 arranged sequentially on substrate 31. The magnetic layer 39 may be formed by alternately disposing magnetic domain forming regions 32 and magnetic domain wall forming regions 34 on the intermediate layers 35, 37.

Referring to FIGS. 2A and 2B, the magnetic anisotropic energy of the magnetic domain forming regions 22 and 32 may be between about $2 \times 10^3$ and about $10^7$ J/m$^3$, inclusive. According to example embodiments, the magnetic anisotropic energy of the magnetic domain forming regions 22 and 32 may be similar, substantially similar, or different. The magnetic anisotropic energy of the magnetic domain wall forming regions 24 and 34 may be between about 10 and about $10^3$ J/m$^3$, inclusive. According to example embodiments, the magnetic anisotropic energy of the magnetic domain wall forming regions 24 and 34 may be the same, substantially the same, or different.

As shown in FIGS. 2A and 2B, the magnetic tracks 30 and 40 may differ in that the intermediate layers 25, 27 and the intermediate layers 35, 37 may be structured differently. These differences will be discussed in more detail below.

The magnetic domain wall is a boundary portion between magnetic domains, and thus, may be smaller than the size of the magnetic domain. A magnetic domain may include a portion of a region in which magnetic domain walls are formed.

Still referring to FIGS. 2A and 2B, the magnetic layers 29 and 39 may be formed of, for example, Co or a Co alloy and Pt or may be formed of Co or a Co alloy and Pd. The magnetic layers 29 and 39 may be formed to have a multi-layer or stack structure in which n (e.g., $1 \leq n \leq 25$) layers are stacked. In at least this example, the Co or the Co alloy may be, for example, CoCr, CoCu, CoTb, CoFeTb, CoFeGd, CoFeNi, a combination thereof, or the like.

Magnetic anisotropic energies of the magnetic layers 29 and 39 may vary according to materials formed under the magnetic layers 29 and 39. According to example embodiments, materials used in forming the intermediate layers 25, 27, 35, and 37 under the magnetic layers 29 and 39 may be changed so that magnetic anisotropic energies of the magnetic layers 29 and 39 vary in different portions of the magnetic layers 29 and 39. According to example embodiments, portions of the intermediate layers 25 35 may be referred to as first material regions, whereas portions of the intermediate layers 27 and 37 may be referred to as second material regions. Accordingly, first material regions 25 and 35 and second material regions 27 and 37 may be alternately formed as intermediate layers 25 and 27 and 35 and 37 under the magnetic layers 29 and 39, respectively.

Referring back to FIG. 2A, after the first material region 25 is formed on the seed layer 23, the patterned second material region 27 may be formed so that the first material region 25 and the second material region 27 may be disposed alternately with a given step difference. Accordingly, the magnetic domain forming regions 22 may have down-sloping sides and an upper surface that is arranged at a lower level than an upper surface of the magnetic domain wall forming regions 24.

In addition, referring to FIG. 2B, the first material region 35 and the second material region 37 may be alternately disposed on the seed layer 33 on the same or substantially the same plane. As shown, the upper surfaces of the first material region 35 and the second material region 37 may be planar or substantially planar.

The first material regions 25 and 35 may be formed of, for example, Pt, and/or the second material regions 27 and 37 may be formed of, for example, Ru.

The seed layers 23 and 33 may be formed of, for example, a material selected from the group consisting of or including Ta, TaO$_2$, Ti, TiO$_2$, a combination thereof, or the like.

Figure 3A:
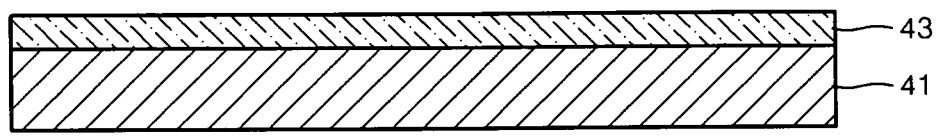
FIGS. 3A through 3F illustrate a method of manufacturing a magnetic track of an image storage device according to an example embodiment.
Figure 3B:
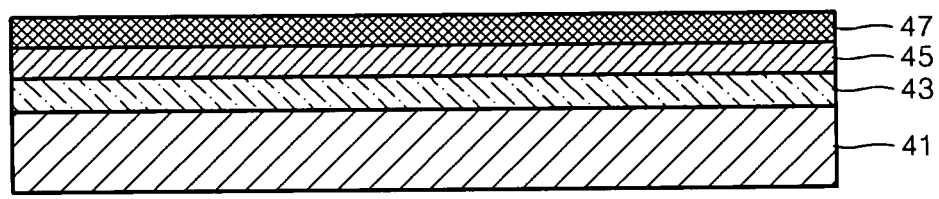
Figure 3C:
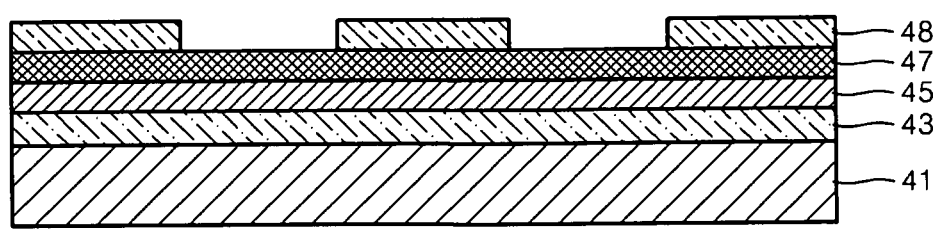
Figure 3D:
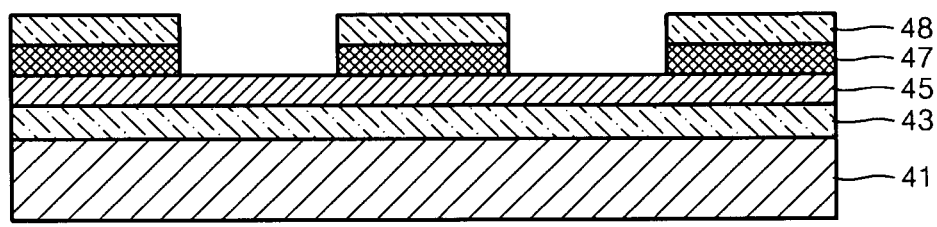
Figure 3E:
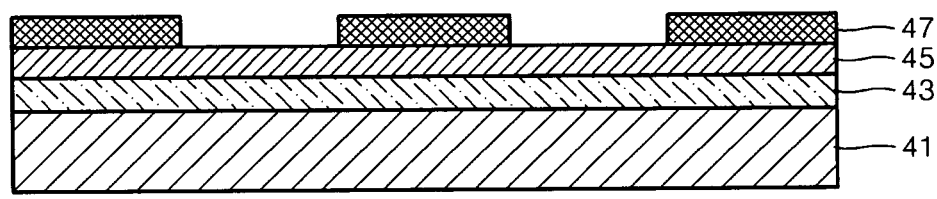

FIGS. 3A through 3F illustrate a method of manufacturing a magnetic track of an information storage device according to an example embodiment. The example embodiment shown in FIGS. 3A through 3F may be used to manufacture the magnetic track shown in FIG. 2A, for example. Referring to FIGS. 3A and 3B, a seed layer 43, a first material region 45, and a second material region 47 may be sequentially formed on a silicon substrate 41. In at least this example embodiment, the seed layer 43 may be formed of Ta, and the first material region 45 may be formed of Pt. The second material region 47 may be formed of, for example, Ru. The seed layer 43, the first material region 45, and the second material region 47 may be formed at a given (e.g., normal) temperature using a sputtering process or the like.

Referring to FIGS. 3C through 3F, a mask 48 may be formed on the second material region 47. The second material region 47 may be patterned using, for example, reactive ion etching (RIE). The mask 48 may be removed. By removing the mask 48, the first material region 45 and the second material region 47 may be alternately disposed with a given step difference. A magnetic layer 49 may be formed on the first material region 45 and the patterned second material region 47 using, for example, an atomic layer deposition (ALD) process. The magnetic layer 49 may be formed to have a multi-layer or stack structure by repeatedly forming a CoFe/Pt layer, for example.

Figure 3F:
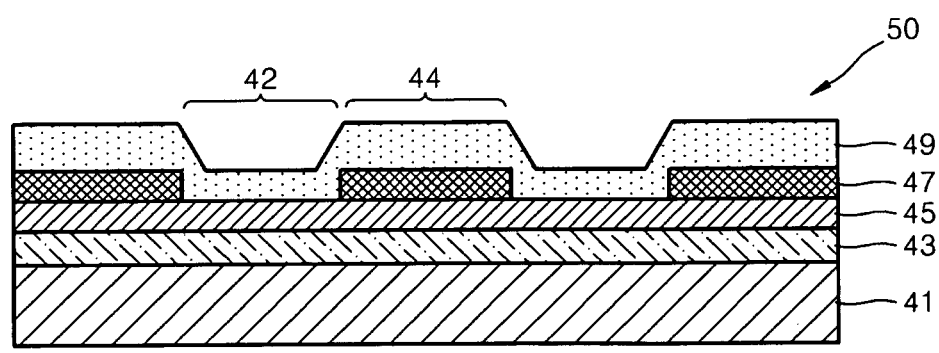

Referring to FIG. 3F, the magnetic layer 49 may include a magnetic domain forming region 42 contacting the first material region 45 of the intermediate layers 45 and 47 and a magnetic domain wall forming region 44 contacting the second material region 47. As such, a magnetic track 50 in which the first material region 45 and the second material region 47 are alternately formed under the magnetic layer 49, may be manufactured.

Figure 4A:
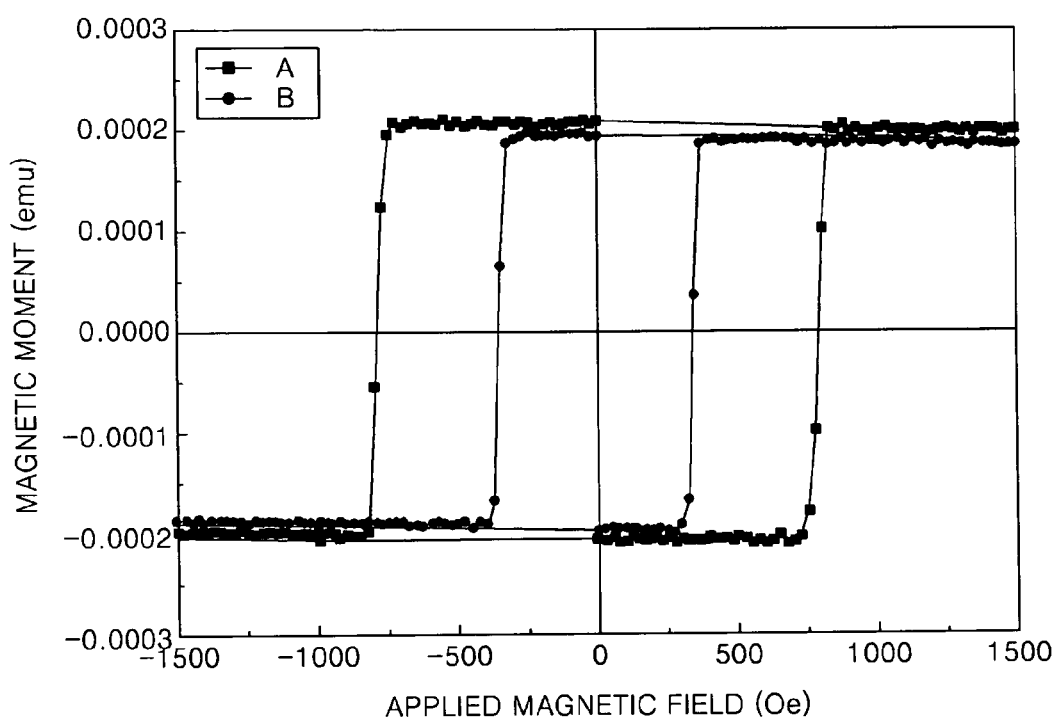
FIGS. 4A and 4B are graphs illustrating magnetic characteristics of a magnetic track according to an example embodiment.
Figure 4B:
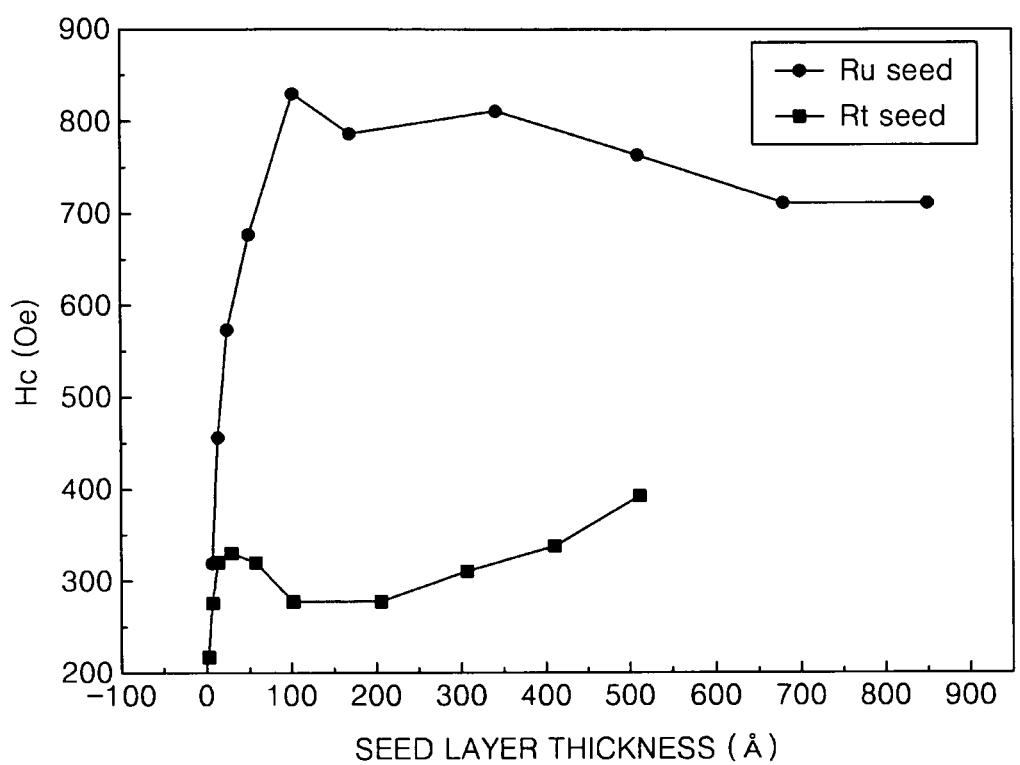

FIGS. 4A and 4B are graphs illustrating magnetic characteristics of a magnetic track according to an example embodiment. In these example characteristics, after forming the magnetic track having the structure of FIG. 2B, a magnetic moment characteristic (M-H curve) according to an applied magnetic field was measured to determine a magnetic characteristic of a magnetic layer according to a material formed under the magnetic layer of the magnetic track. Sample A in FIGS. 4A and 4B includes a seed layer formed of Ta on a silicon substrate and an intermediate layer formed of Pt to a thickness of about 100 Å. A magnetic layer is formed by stacking a CoFe/Pt layer five times. Sample B in FIGS. 4A and 4B includes a seed layer formed of Ta on a silicon substrate and a Ru layer having a thickness of 300 Å formed on an intermediate layer formed of Pt having a thickness of 100 Å. A magnetic layer is formed by stacking a CoFe/Pt layer five times.

Referring to FIGS. 4A and 4B, magnetic anisotropic energies of samples A and B are different from each other resulting in a step difference. In addition, the magnetic anisotropic energy of sample A is relatively large.

As described above, according to example embodiments, a material formed under a magnetic layer may be changed to induce a magnetic domain and a magnetic domain wall forming region of the magnetic layer so that an information storage device for controlling a magnetic domain wall is realized.

In methods of manufacturing information storage devices according to example embodiments, information storage devices, which have simpler and/or easier manufacturing processes are provided.

While example embodiments have been particularly shown and described with reference to the example embodiments shown herein, it will be understood by those of ordinary skill in the art that various changes in form and details may be made therein without departing from the spirit and scope of the present invention as defined by the following claims.

What is claimed is:

1. A magnetic track comprising:
    an intermediate layer arranged on a substrate, the intermediate layer including at least one first material region forming a magnetic domain and at least one second material region forming a magnetic domain wall arranged alternately on the substrate, the at least one first material region and the at least one second material region being different materials; and a magnetic layer formed on the intermediate layer in a lengthwise direction, the magnetic layer including at least one magnetic domain forming region and at least one magnetic domain wall forming region arranged alternately in the lengthwise direction; wherein the magnetic track includes a plurality of magnetic domains and a plurality of magnetic domain walls arranged alternately in the lengthwise direction, the plurality of magnetic domain walls being movable within the magnetic track in the lengthwise direction in response to at least one of an applied current and an applied magnetic field.

2. The magnetic track of claim 1, wherein each of the at least one magnetic domain forming regions corresponds to one of the at least one first material region, and each of the at least one magnetic domain wall forming regions corresponds to one of the at least one second material regions, each magnetic domain forming region and corresponding first material region constituting one of the plurality of magnetic domains, and each magnetic domain wall forming region and corresponding second material region constituting a magnetic domain wall.

3. The magnetic track of claim 1, wherein a magnetic anisotropic energy of the at least one magnetic domain forming region is between about $2 \times 10^3$ and about $10^7$ J/m$^3$, inclusive.

4. The magnetic track of claim 1, wherein a magnetic anisotropic energy of the at least one magnetic domain wall forming region is between about 10 and about $10^3$ J/m$^3$, inclusive.

5. The magnetic track of claim 1, wherein the at least one first material region is formed of Pt and the second material region is formed of Ru.

6. The magnetic track of claim 1, wherein the at least one second material region is formed by adding Pt to a lower portion of Ru.

7. The magnetic track of claim 1, wherein the magnetic layer is a multi-layer structure formed of Co or a Co alloy and Pt.

8. The magnetic track of claim 7, wherein the magnetic layer is a multi-layer structure formed of CoFe and Pt.

9. The magnetic track of claim 1, wherein the magnetic layer is a multi-layer structure formed of Co or a Co alloy and Pd.

10. The magnetic track of claim 1, further comprising:
a seed layer formed between the substrate and the intermediate layer.

11. An information storage device comprising:
the magnetic track of claim 1.

12. The information storage device of claim 11, further comprising:
a current applying unit connected to the magnetic track.

13. The information storage device of claim 11, further comprising:
a read/write unit configured to read and write data to magnetic track.

14. The information storage device of claim 11, wherein each magnetic domain wall is positioned at a boundary between adjacent magnetic domains.

15. The magnetic track of claim 1, wherein the first material region and the second material region are different non-magnetic materials.

16. The magnetic track of claim 1, wherein the magnetic layer is in contact with the intermediate layer.

17. A method of manufacturing a magnetic track for an information storage device, the magnetic track including an intermediate layer arranged on a substrate, and a magnetic layer on the intermediate layer in a lengthwise direction, the method comprising:

forming a seed layer on a substrate;
forming the intermediate layer on the seed layer, the intermediate layer including at least one first material region and at least one second material region arranged alternately, the at least one first material region and the at least one second material region are different materials; and forming the magnetic layer on the intermediate layer, the magnetic layer including at least one magnetic domain forming region and at least one magnetic domain wall forming region arranged alternately in the lengthwise direction on the intermediate layer; wherein the magnetic track includes a plurality of magnetic domains and a plurality of magnetic domain walls arranged alternately in the lengthwise direction, and the plurality of magnetic domain walls are movable within the magnetic track in the lengthwise direction in response to at least one of an applied current and an applied magnetic field.

18. The method of claim 17, wherein the at least one first material region is formed of Pt and the second material region is formed of Ru.

19. The method of claim 17, wherein the forming of the intermediate layer includes,
forming the at least one at first material region, and
patterning the at least one second material region on the at least one first material region.

20. The method of claim 17, wherein the forming of the intermediate layer includes,
alternately disposing the at least one first material region and the at least one second material region on the seed layer.

21. The method of claim 17, wherein the magnetic layer is a multi-layer structure of CoFe and Pt.

22. The method of claim 21, wherein the magnetic layer is formed using atomic layer deposition (ALD).

* * * * *